(12) United States Patent
Weese et al.

(10) Patent No.: US 11,249,160 B2
(45) Date of Patent: Feb. 15, 2022

(54) IMAGE SEGMENTATION USING REFERENCE GRAY SCALE VALUES

(71) Applicant: KONINKLIJKE PHILIPS N.V., Eindhoven (NL)

(72) Inventors: Rolf Jurgen Weese, Norderstedt (DE); Steffen Weiss, Hamburg (DE); Jochen Peters, Norderstedt (DE)

(73) Assignee: Koninklijke Philips N.V., Eindhoven (NL)

(*) Notice: Subject to any disclaimer, the term of this patent is extended or adjusted under 35 U.S.C. 154(b) by 186 days.

(21) Appl. No.: 16/493,551

(22) PCT Filed: Mar. 15, 2018

(86) PCT No.: PCT/EP2018/056475
§ 371 (c)(1),
(2) Date: Sep. 12, 2019

(87) PCT Pub. No.: WO2018/172169
PCT Pub. Date: Sep. 27, 2018

(65) Prior Publication Data
US 2020/0003857 A1 Jan. 2, 2020

(30) Foreign Application Priority Data

Mar. 20, 2017 (EP) .................................... 17161811

(51) Int. Cl.
*G06K 9/00* (2006.01)
*G01R 33/48* (2006.01)
(Continued)

(52) U.S. Cl.
CPC ..... *G01R 33/4828* (2013.01); *G01R 33/5608* (2013.01); *G01R 33/58* (2013.01);
(Continued)

(58) Field of Classification Search
CPC .................................................. G01R 33/4828
See application file for complete search history.

(56) References Cited

U.S. PATENT DOCUMENTS 6,965,235 B1 11/2005 Guclu et al.
2007/0276214 A1 11/2007 Dachille et al.
(Continued)

FOREIGN PATENT DOCUMENTS

EP 2930636 A1 10/2015

OTHER PUBLICATIONS

Randall W. Holt et al., MR Susceptometry: an External-Phantom Method for Measuring Bulk Susceptibility from Field-Echo Phase Reconstruction Maps; JMRI Nov./Dec. 1994 p. 809-818.
(Continued)

*Primary Examiner* — Oneal R Mistry

(57) ABSTRACT

The invention provides for a medical imaging system (100, 300, 400) comprising a memory (110) containing machine executable instructions (120) and a processor (106). Execution of the machine executable instructions cause the processor to: receive (200) a magnetic resonance image (300), receive (202) meta data descriptive of the magnetic resonance image, wherein the metadata comprises reference gray scale value data (124) for two or more tissue types; and segment (204) the magnetic resonance image using an image segmentation algorithm (126) that uses the reference gray scale value data.

13 Claims, 9 Drawing Sheets

(51) Int. Cl.
*G06T 7/11* (2017.01)
*G01R 33/56* (2006.01)
*G01R 33/58* (2006.01)
*G06T 7/00* (2017.01)

(52) U.S. Cl.
CPC ............. *G06T 7/0012* (2013.01); *G06T 7/11* (2017.01); *G06T 2207/10088* (2013.01); *G06T 2207/20128* (2013.01); *G06T 2207/30004* (2013.01)

(56) References Cited

U.S. PATENT DOCUMENTS

| | | |
|---|---|---|
| 2008/0077006 A1 | 3/2008 | Katscher et al. |
| 2009/0292559 A1* | 11/2009 | Ranjan ................. G16H 30/40 705/3 |
| 2010/0111390 A1 | 5/2010 | Fenchel et al. |
| 2010/0266190 A1 | 10/2010 | Zagorchev et al. |
| 2011/0043206 A1 | 2/2011 | Kimura et al. |
| 2011/0188720 A1 | 8/2011 | Narayanan et al. |
| 2013/0090946 A1 | 4/2013 | Foo et al. |
| 2013/0200900 A1 | 8/2013 | Burrman et al. |
| 2013/0243287 A1* | 9/2013 | Thomson .................. G06T 7/11 382/128 |
| 2015/0235362 A1 | 8/2015 | Ghosh et al. |
| 2017/0324887 A1* | 11/2017 | Min .......................... H04N 9/64 |

OTHER PUBLICATIONS

L.G. Nyul, J. K. Udupa „On standardizing the MR image intensity scale, Magnetic Resonance in Medicine 1999, 42(6), 1072-1081.

J. Peters et al. „Optimizing boundary detection via Simulated Search with applications to multi-modal heart segmentation, Medical Image Analysis 2010, 14(1), 70-84.

H. Benoit-Cattin et al. "The SIMRI project: a versatile and interactive MRI simulator", Journal of Magnetic Resonance 2005, 173, 97-115.

T. Stöcker et al. "High-performance computing MRI simulations", Magnetic Resonance in Medicine 2010, 64(1), 186-193.

O. Ecabert et al. "Segmentation of the heart and great vessels in CT images using a model-based adaptation framework", Medical Image Analysis 2011, 15(6), 863-876.

International Search Report from PCT/EP2018/056475 dated Jul. 12, 2018.

O. Echabert et al "Automatic Model Based Segmentation of the Heart in CT Images" IEEE Transactions on Medical Imaging, vol. 27, No. 9, Sep. 2008 p. 1189-1201.

\* cited by examiner

IMAGE SEGMENTATION USING REFERENCE GRAY SCALE VALUES

CROSS REFERENCE TO RELATED APPLICATIONS

This application is a U.S. national phase application of International Application No. PCT/EP2018/056475 filed on Mar. 15, 2018, which claims the benefit of EP Application Serial No. 17161811.9 filed on Mar. 20, 2017 and is incorporated herein by reference.

FIELD OF THE INVENTION

The invention relates in magnetic resonance imaging, in particular to image segmentation in magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

MRI scanners are able to construct images of either slices or volumes. A slice is a thin volume that is only one voxel thick. A voxel is a small volume over which the MRI signal is averaged, and represents the resolution of the MRI image. A voxel may also be referred to as a pixel herein.

United States patent application US 2008/0077006 A1 discloses an MR method for determining local relaxation time values of an examination object. Firstly, two or more MR images of the examination object are recorded, each with different time parameter sets of an imaging sequence. MR images of a phantom are likewise recorded, wherein the same time parameter sets of the imaging sequence are used and wherein the phantom has a known spatial distribution of relaxation time values. The local relaxation time values of the examination object are determined by comparing image values of the MR images of the examination object with image values of the MR images of the phantom and by assigning image values of the MR images of the phantom to relaxation time values according to the known spatial distribution of relaxation time values of the phantom.

The US-patent application US2011/0188720 is concerned with the problem of providing a more accurate and reliable automated segmentation of intensity images. This US-patent application proposes to achieve this by scaling the contrast of the intensity image on the basis of the (MR) acquisition parameters.

SUMMARY OF THE INVENTION

The invention provides for a medical imaging system, a computer program product and a method in the independent claims. Embodiments are given in the dependent claims.

After acquisition of a magnetic resonance image, the magnetic resonance image may be segmented or divided into different regions. This may be useful to identify anatomical structures or even to identify anatomical abnormalities such as tumors. A difficulty with using automatic segmentation algorithms is that differences in the contrast or grey values in the image for particular tissue types may vary according to changes in the acquisition protocol. Embodiments may solve this problem by using metadata that contains reference grey scale value data for a particular image. The reference grey scale value data may be used to modify the segmentation algorithm.

In one aspect, the invention provides for a medical imaging system comprising a memory containing machine-executable instructions. The medical imaging system further comprises a processor. Execution of the machine-executable instructions cause the processor to receive a magnetic resonance image. The magnetic resonance image may for example be received from another computer system or medical imaging system or may be generated by the medical imaging system itself by reconstructing the magnetic resonance image.

Execution of the machine-executable instructions further causes the processor to receive meta data descriptive of the magnetic resonance image. The meta data comprises reference grayscale value data for two or more tissues. The reference grayscale value data may be descriptive of the grayscale value of tissues imaged within the magnetic resonance image. Execution of the machine-executable instructions further cause the processor to segment the magnetic resonance image using an image segmentation algorithm using the reference grayscale value data. The reference grayscale value data may be used to modify the behavior of the image segmentation algorithm. This embodiment may be beneficial because magnetic resonance images or data from different MRI systems and/or different imaging protocols may have different grayscale values for identical types of tissues.

Modifying the image segmentation algorithm with the reference grayscale value data may enable more accurate segmentation of a magnetic resonance image.

In different examples, the reference grayscale value data may take different forms. In one example it may comprise a set of reference grayscale values. That is to say there may be numerical values which are referenced to a particular tissue type of interest. These reference grayscale values may for example either be modeled or may be experimentally measured. For example, phantoms may be measured to obtain a reference grayscale value. In yet other cases, the data can be measured in the form of an image or even a histogram for a particular region. In this case, the segmentation of the magnetic resonance imaging using the image segmentation algorithm may also comprise processing the grayscale value data into a form which can be used to modify the image segmentation algorithm. For example if the reference grayscale value data is provided in the form of an image there may be some data processing or statistical measures which are applied to that image or the region within the image.

In another embodiment, the image segmentation is a trained image segmentation algorithm.

In another embodiment, execution of the machine-executable instructions further cause the processor to render the magnetic resonance image with the segmentation.

In another embodiment, the medical imaging system further comprises a magnetic resonance imaging system. The medical imaging system further comprises pulse sequence commands for controlling the magnetic resonance imaging system to acquire magnetic resonance data. Execution of the machine-executable instructions further causes the medical imaging system to control the magnetic resonance imaging system using the pulse sequence commands to acquire the magnetic resonance data. Execution of the machine-executable instructions further causes the medical imaging system to reconstruct the magnetic resonance image from the magnetic resonance data. This reconstruction may be equivalent to receiving the magnetic resonance image. Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

Execution of the machine-executable instructions further causes the medical imaging system to generate the reference grayscale value data. This may also include attaching or including the reference grayscale value data into the metadata. Generating the reference grayscale value data may be equivalent to receiving the metadata with the reference grayscale value data.

The reference grey scale data may take different forms in different examples. The reference grey scale data in some examples may be generated by modeling and in other examples it may be taken from measurements from phantoms. In addition to being provided in different way the reference grey scale data may take different forms. The reference grey scale data could include raw image data for processing, it could include a summary of grey scale values for particular tissue types, and/or even comprise statistics or summaries of grey scale values for tissue types or organs. An example would be a histogram of grey scale values for a phantom image or a simulated grey scale histogram.

In some examples as mentioned above, the reference grayscale value data may for instance be generated by taking measurements from phantoms. In this case there may be multiple regions of interest which are imaged with the pulse sequence commands. The magnetic resonance data may therefore be used to reconstruct more than one single image. For example there may be a region of interest which corresponds to a clinical region of interest of the subject and one or more region of interest to image phantoms. Likely in this case the same pulse sequence commands would be used for all of the various regions of interest however, the area being imaged would be changed. That is to say the same pulse sequence commands are used from the different regions of interest but that the region that is being imaged is simply shifted or moved.

In another embodiment, the generation of the reference grayscale value data is performed by modeling using the pulse sequence commands and a magnetic resonance simulator. This embodiment may be beneficial because it may provide a straight forward means of generating the reference grayscale value data.

In another embodiment, the magnetic resonance simulator is a Bloch simulator.

In another embodiment, the magnetic resonance simulator is a phase graph simulator.

In another embodiment, execution of the machine-executable instructions further causes the processor to identify multiple phantom regions corresponding to each of the two or more tissue types within a magnetic resonance image. In some embodiments the magnetic resonance image may be a single magnetic resonance image. In other examples there may be a diagnostic magnetic resonance image and a phantom magnetic resonance image. If there are two images then the multiple phantom regions will be within the phantom magnetic resonance image. The reference grayscale value data is at least partially determined using the magnetic resonance image. This embodiment may be beneficial because it may provide a means to directly measure an expected gray value.

The determinant of the reference grayscale value data in this matter may take different forms. For example it may be generated by calculating a statistical value of grayscales within each of the multiple phantom regions. In other cases it may just be a portion of the raw image data which can then be analyzed later.

In another embodiment, the magnetic resonance imaging system comprises an imaging coil. The imaging coil comprises a magnetic resonance phantom for each of the two or more tissues types. This embodiment may be beneficial because it may provide an easy to use and uniform way of providing the reference grayscale value data.

In another embodiment, the magnetic resonance phantom for each of the two or more tissue types has a predetermined geometric location relative to each other. The multiple phantom regions are identified at least partially using the predetermined geometric location. This embodiment may be beneficial because it may make it easier to identify the multiple phantom regions corresponding to the two or more tissues types.

In another embodiment the phantom for each of the two or more tissue types comprises a phantom material with a controlled proton density, a controlled T1 value, and a controlled T2 value which models the corresponding two or more tissue types. This embodiment may be beneficial because controlling the proton density, T1 and T2 values may be an effective means of modeling the grayscale of a tissue using magnetic resonance imaging.

In another embodiment, the image segmentation algorithm comprises an atlas-matching algorithm for segmenting the magnetic resonance image. The atlas-matching algorithm is adjusted using the reference grayscale values. This embodiment may be beneficial because using the reference grayscale values with the atlas-matching algorithm may enable accurate segmentation results on a broad scale of acquisition protocols and different MR systems. When using an atlas-matching algorithm to segment the magnetic resonance image, the reference grey scale values can be either used to modify the behavior of the atlas-matching algorithm or to modify the magnetic resonance image so that the segmentation is performed properly.

In another embodiment, the image segmentation algorithm comprises a mesh model for segmenting the magnetic resonance image. The mesh model is adjusted using the reference grayscale values. This for example may be accomplished by identifying portions of the mesh model that use grayscale values. For example the reference grey scale values may be useful in modifying the behavior of edge detection algorithms or when evaluating grey scale values in the magnetic resonance image near the boundaries of the model. This may provide for a more robust means of operating the mesh model.

The mesh model may for example be a parametric mesh model or a deformable mesh model that minimizes a penalty function when adapting the mesh model.

In another embodiment, the image segmentation algorithm comprises a voxel classifier for segmenting the magnetic resonance image by classifying individual voxels using gray scale values and a neighborhood of the individual voxels. The voxel classifier algorithm may classify each voxel as to a particular tissue type and/or classify it as belonging to a particular organ or anatomical structure. The voxel classifier may use grey scales as input. The voxel classifier may also use voxels within a predetermined neighborhood of a voxel to assist in the classification. The voxel classifier may be adjusted using the reference gray scale values. The voxel classifier could for example be a histogram-based segmentation model or a neural network segmentation model.

In another embodiment, the image segmentation algorithm comprises a histogram-based segmentation model for segmenting the magnetic resonance image. The histogram-based segmentation model is adjusted using the reference grayscale values. For example either the grayscale values in the magnetic resonance image or in the histogram model itself could be adjusted by comparing the reference grayscale values to the grayscales in the histogram-based segmentation model.

In another embodiment, the image segmentation algorithm comprises an edge detection algorithm for approximating boundary detections between the two or more tissues types. The reference gray scale values may be used, for example, to decide whether boundaries between two types of tissue or organs change from bright to dark or vice versa as the boundary between the two is crossed. The reference grey scale values can be used to decide the appropriate gradient direction of the grey scales as the boundary between tissue types is crossed. The reference grey scale values may also be used to determine the grey scale values within an organ or anatomical region once the boundary has been crossed. This may be useful in reducing the chances that a boundary is incorrectly identified by the model.

In another embodiment, the image segmentation algorithm comprises a generalized Hough transform for detecting anatomical structures corresponding to the two or more tissue types within the magnetic resonance image. The generalized Hough transform comprises a boundary detection algorithm. Execution of the machine-executable instructions comprises modifying the boundary detection algorithm using the reference grayscale value data before segmenting the magnetic resonance image.

In another embodiment, the image segmentation algorithm comprises a random forest decision algorithm for detecting anatomical structures corresponding to the two or more tissue types within the magnetic resonance image. The random forest decision algorithm could possibly contain gray scale values which are used and may also comprises a boundary detection algorithm. Execution of the machine-executable instructions comprises modifying the boundary detection algorithm using the reference grayscale value data before segmenting the magnetic resonance image.

In another embodiment, the image segmentation algorithm comprises a parametric mesh model. The generalized Hough transform is configured for initializing the parametric mesh model. The parametric model is configured for adapting the parametric mesh model to segment the magnetic resonance image. In a variation of this embodiment the random forest decision algorithm is used to initialize the parametric mesh model instead.

In another embodiment, the parametric mesh model comprises boundary points. The parametric mesh model could for example be trained for individually adjusting each boundary point.

In another embodiment execution of the machine-executable instructions further cause the processor to rescale gray values in the magnetic resonance image to a reference interval. Execution of the machine-executable instructions further cause the processor to rescale the reference grayscale value data to the reference interval.

In some examples, the grayscales in the image may first be sorted in an image histogram and then calculated as low and high percentiles, for example somewhere between the lowest 2-5% values and then rescaling to get rid of the highest and/or lowest 2-5% of these values. The image histogram may then be rescaled to the reference interval. In tests it is shown that getting rid of the highest and/or lowest 2-5% of the values may make the image segmentation algorithms perform better.

Alternatively this could also be performed by histogram matching. For a particular region of interest such as the brain you may already know specific grayscale histogram profiles that correspond to the distribution of tissues types within that region of interest. For example, in the brain for a given region of interest the distribution of bony tissue, grey matter, and white matter should have a well known distribution within a histogram. The reference gray scale values can be used to at least partially modify the magnetic resonance image so that its grey scales are modified to fit a histogram that functions with a particular segmentation model. Also the algorithm for performing the segmentation can be modified using the reference grey scale values.

In another embodiment, the meta data is contained in the DICOM header of the magnetic resonance image. This may be beneficial in that it may provide a new use for an existing DICOM header which enables the improvement of the segmentation algorithm.

In another aspect, the invention provides for a computer program product comprising machine-executable instructions for execution by a processor controlling the medical imaging system. Execution of the machine-executable instructions causes the processor to receive a magnetic resonance image. Execution of the machine-executable instructions further causes the processor to receive meta data descriptive of the magnetic resonance image. The meta data comprises reference grayscale value data for two or more tissue types. Execution of the machine-executable instructions further cause the processor to segment the magnetic resonance image using an image segmentation algorithm using the reference grayscale value data.

In another aspect, the invention provides for a method of operating a medical imaging system. The method comprises receiving a magnetic resonance image. The method further comprises receiving meta data descriptive of the magnetic resonance image. The meta data comprises reference grayscale value data for two or more tissue types. The method further comprises segmenting the magnetic resonance image using an image segmentation algorithm using the reference grayscale value data.

In another aspect, an example may provide for a medical imaging system that comprises a magnetic resonance imaging system. The medical imaging system may further comprise a memory containing machine-executable instructions and pulse sequence commands for controlling the magnetic resonance imaging system to acquire magnetic resonance data. The medical imaging system may further comprise a processor. Execution of the machine-executable instructions causes the processor to control the magnetic resonance imaging system to acquire the magnetic resonance data. Execution of the machine-executable instructions further causes the processor to reconstruct the magnetic resonance image from the magnetic resonance data. Execution of the machine-executable instructions further causes the processor to generate reference grayscale value data for two or more tissue types. The reference grayscale values are modeled at least partially using the pulse sequence commands and a magnetic resonance simulator.

Execution of the machine-executable instructions further causes the processor to generate meta data for the magnetic resonance image. The meta data comprises the reference grayscale value data.

In another aspect, examples provide for a medical imaging system comprising a magnetic resonance imaging system. The medical imaging system may further comprise a memory containing machine-executable instructions and pulse sequence commands for controlling the magnetic resonance imaging system to acquire magnetic resonance data. The medical imaging system may further comprise a processor for controlling the magnetic resonance imaging system. Execution of the machine-executable instructions may further cause the processor to control the magnetic resonance imaging system to acquire the magnetic resonance data. Execution of the machine-executable instructions may further cause the processor to reconstruct the magnetic resonance image from the magnetic resonance data. Execution of the machine-executable instructions may further cause the processor to identify multiple phantom regions corresponding to two or more tissue types within the magnetic resonance image. These multiple phantom regions may also be in a separate diagnostic or phantom magnetic resonance image in some examples. Execution of the machine-executable instructions further causes the processor to generate reference grayscale value data for the two or more tissue types. The reference grayscale value data is generated by calculating a statistical value of grayscale values within each of the multiple phantom regions. Execution of the machine-executable instructions further causes the processor to generate meta data for the magnetic resonance image. The meta data comprises the reference grayscale values.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, webcam, headset, pedals, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
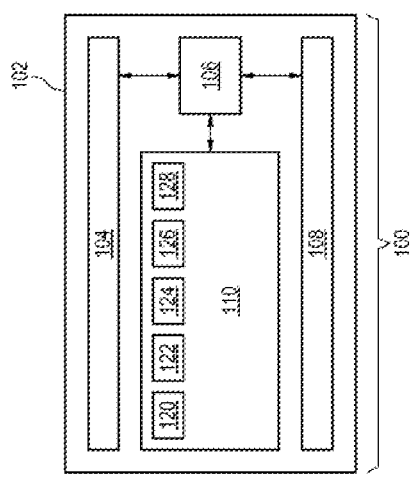
FIG. 1 illustrates an example of a medical imaging system.

FIG. 1 illustrates an example of a medical imaging system 100. The medical imaging system 100 is shown as comprising a computer 102. The computer comprises an optional hardware interface. The hardware interface 104 is connected to a processor. The processor is also connected to a memory 110 and an optional user interface 108. The hardware interface 104 may enable the processor 106 to send and receive data to other components of the medical imaging system. For example, this may be used for exchanging data and/or to control a medical imaging apparatus such as a magnetic resonance imaging system. The user interface 108 may for example contain a display or input devices for receiving input from a user and/or for displaying and/or rendering images.

The computer memory or simply memory 110 is representative of any combination of memory which is directly accessible to the processor 106. The memory 110 may be any combination of memory which is accessible to the processor 130. This may include such things as main memory, cached memory, and also non-volatile memory such as flash RAM, hard drives, or other storage devices. In some examples the memory 130 may be considered to be a non-transitory computer-readable medium.

The computer memory 110 is shown as containing machine-executable instructions 120 which enable the processor 106 to either manipulate data and/or possibly to control other components of the medical imaging system 100. The memory 110 is further shown as containing a magnetic resonance image 122 that it had for example received via a network connection or may have possibly also have reconstructed itself. The computer memory 110 is further shown as containing a reference grayscale data 124 for the magnetic resonance image 122. The reference grayscale data 124 may for example have values which represent the expected grayscale of particular tissue types within the magnetic resonance image 122.

In other examples, the reference grayscale data 124 may contain portions or indicate portions of an additional magnetic resonance image for example taken from measurements on phantoms. The computer memory 110 is further shown as containing an image segmentation algorithm 126. The image segmentation algorithm 126 may take the magnetic resonance image 122 and the reference grayscale data 124 as an input. The image segmentation algorithm 126 then outputs the image segmentation 128 which is also shown as being stored in the memory 110.

Figure 2:
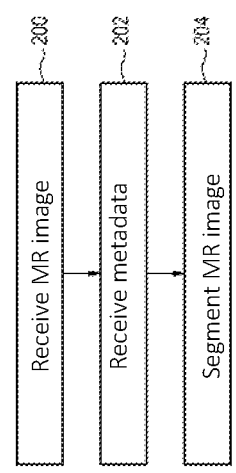
FIG. 2 shows a flow chart which illustrates an example of a method for operating the medical imaging system of FIG. 1.

FIG. 2 shows a flowchart which illustrates an example of a method for operating the medical imaging system 100 of FIG. 1. First in step 200 a magnetic resonance image 122 is received. Next in step 202 meta data which comprises the reference grayscale data 124 is received. Next in step 204 the magnetic resonance image 122 is segmented using an image segmentation algorithm 126 that uses the reference grayscale data 124 to modify its behavior.

Figure 3:
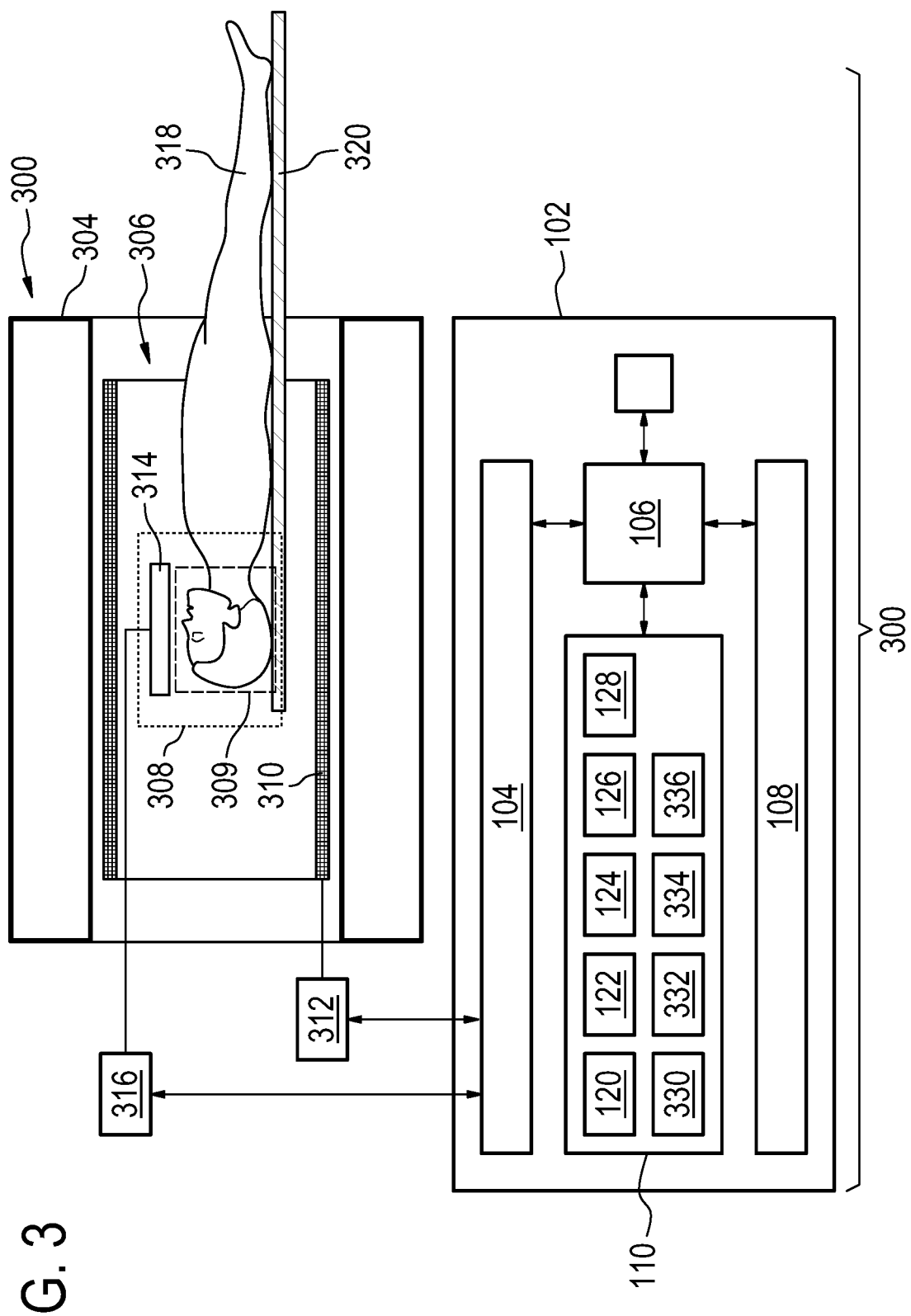
FIG. 3 illustrates a further example of a medical imaging system.

FIG. 3 shows a further example of a medical imaging system 300. The medical imaging system 300 is similar to the medical imaging system 100 in FIG. 1 except that it additionally incorporates a magnetic resonance imaging system 300. The magnetic resonance imaging system 300 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 108 where the magnetic field is strong and uniform enough to perform magnetic resonance imaging. A region of interest 309 is shown within the imaging zone 108. A subject 318 is shown as being supported by a subject support 320 such that at least a portion of the subject 118 is within the imaging zone 308 and the region of interest 309.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

The transceiver 316 and the gradient controller 312 are shown as being connected to the hardware interface 104 of the computer system 102.

The computer memory 110 is shown as containing pulse sequence commands 330 which enable the processor 106 to control the magnetic resonance imaging system 300 via the hardware interface 104. The memory 110 is further shown as containing magnetic resonance data 332 that was acquired from the region of interest 309 by controlling the magnetic resonance imaging system 300 with the pulse sequence commands 330. The memory 110 is further shown as containing an image reconstruction module 334 which contains instructions which enable the processor 106 to reconstruct the magnetic resonance image 122 from the magnetic resonance data 332. The memory 110 is further shown as containing a magnetic resonance simulator 336 which contains commands which enable the processor 106 to calculate or generate the reference grayscale data 124 using the pulse sequence commands 330.

Figure 4:
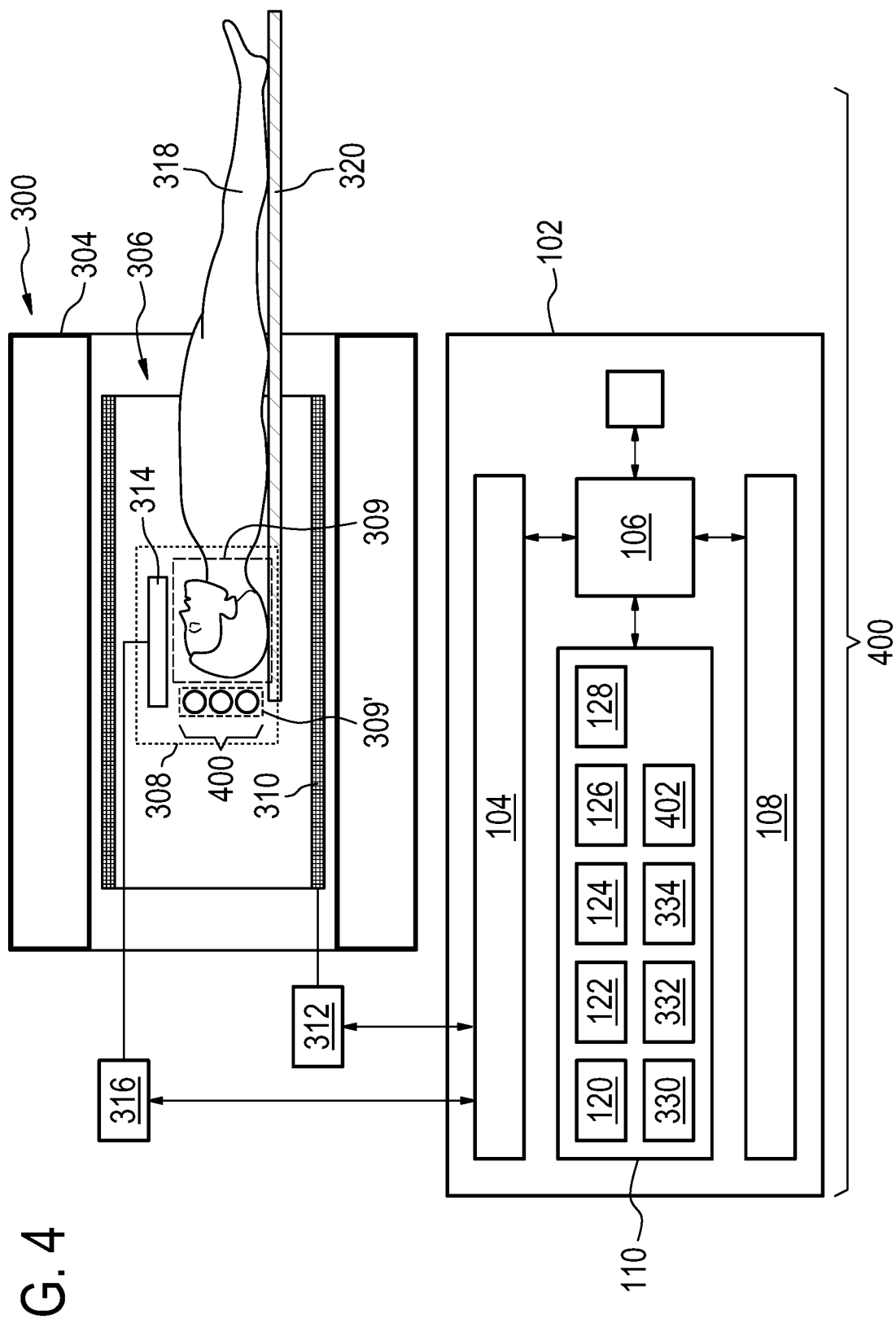
FIG. 4 illustrates a further example of a medical imaging system.

FIG. 4 shows a further example of a medical imaging system 400. The medical imaging system 400 is similar to the medical imaging system 300 shown in FIG. 3, there are however several differences. It can be seen that adjacent to the subject 318 within the imaging zone 308 is a number of phantoms. Within the imaging zone 308 there is also shown an additional region of interest 309' which encompasses a volume that covers the magnetic resonance phantoms 400. The magnetic resonance data 332 in this case contains data acquired from both regions of interest 309 and 309'. The memory 110 is shown as containing an additional magnetic resonance image 402 that was obtained by reconstructing data from the additional imaging zone 309'. The processor 106 may generate the reference grayscale data 124 from the additional magnetic resonance image 402.

Figure 5:
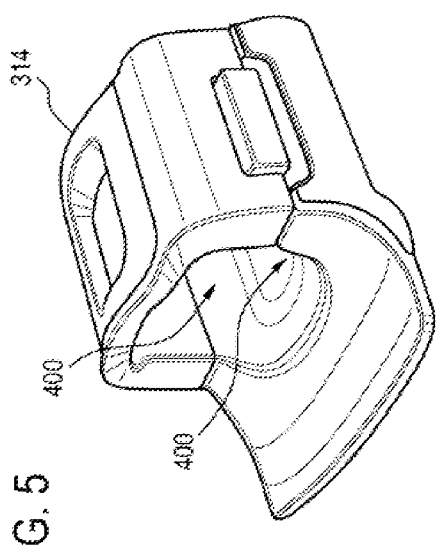
FIG. 5 illustrates an example of a head coil with integrated magnetic resonance phantoms.

FIG. 5 shows an example how the radio-frequency coil 314 and the phantoms 400 illustrated in FIG. 5 may be incorporated into a single unit. In FIG. 5 a head coil for receiving the head of a subject is illustrated. Within the plastic enclosure of the coil 314 a number of phantoms 400 can be placed within it. The coil 314 and phantom arrangement 400 shown in FIG. 5 may have the advantage of being able to easily place the phantoms within the imaging zone adjacent to the subject 318 in a repeatable fashion.

Robustness and applicability of image segmentation of MR images is hampered by the variation of image contrast when the MR protocol is varied, because image grey values depend on the specific set of acquisition parameters and many other variables (system calibration parameters, reconstruction parameters, image post processing parameters). A phantom such as is illustrated in FIG. 5 and incorporated into an MR imaging method may to improve MR image segmentation.

The phantom 400 comprises samples that mimic the relaxation parameters and proton density of most common body tissue types. This phantom is imaged with the same specific sequence and exact parameter set that is used for acquisition and post-processing of the patient images that shall be segmented. The phantom images may automatically pre-processed on the MR console directly after acquisition such that the grey values of the various samples are evaluated and stored in metadata, for example, the DICOM headers of the patient images. Various embodiments of the phantom may be constructed (passive, between arm and trunk of patient; built into MR coils; built into patient support) and of how and when to image the phantom (with each patient; requested by the scanner only if a new scan parameter is used, and from database otherwise).

Image segmentation algorithms may use the pre-processed grey value tables that come with the DICOM patient images. Training of segmentation algorithms is done in relation to the grey value tables. Effectively, this may make the training independent from the exact set of scan parameters. For example, the phantom grey values of grey matter, white matter, and CSF can be used to adapt the segmentation algorithm to the specific contrasts between those tissues.

MR image contrast depends on a large number of variables, including tissue relaxation parameters, proton density, the sequence type and sequence parameters, and system parameters that may vary or be adjusted by the MR system per scan (coil types and positions, amplification and calibration parameters, reconstruction parameters, image post processing parameters). In addition, the image contrast may be affected by artefacts e.g. due to motion. As a consequence, the contrast of images of even the same sequence type varies from scan to scan, from system to system, and from vendor to vendor.

There are numerous applications and there is a growing demand for (semi-) automatic MR image segmentation. Only a few examples may be mentioned here: segmentation for advanced evaluation of MR images (organ masses/volumes, cardiac ejection fraction, vessel sizes), for automatic scan planning (segmentation of organs followed by automatic adaptation of image planes/volumes to those organs), for dose planning in MR-based radiation therapy (planning of volumetric dose to tumour targets and risk organs), or for advanced visualization in 3D (surface rendering).

The variability of MR image contrast is a key problem for (semi-)automatic segmentation of MR images. In comparison, the image contrast of X-ray and CT images is largely defined by the well-defined absorption of radiation in tissue and depends only on a few system parameters. In CT, image grey values even represent a quantitative scale of the radio-density of the tissue, given in Hounsfield units. As a consequence, segmentation of CT images is much simpler than that of MR images, which may even lead to the fact that CT imaging is preferred over MR imaging for certain applications.

In clinical practice, the (semi-)automatic segmentation of MR images only works robustly if the variability of MR image contrast is reduced by enforcing a very specific sequence, a fixed set of protocol parameters, and a fixed set-up for scanning (coil and patient set-up). The segmentation algorithm is then trained and optimized for this specific type of contrast. Deviations from this way of MR image acquisition frequently leads to segmentation errors. Working with a restricted set of parameters could possibly hamper optimal adaptation of imaging to a given clinical situation. Also, many clinicians like to modify the pre-set scans/protocol sets that are delivered with the MR systems in order to adapt scans to their specific clinical needs. This may require renewed training of the segmentation algorithm per customer which is not possible in practice due to extensive effort.

The problem is even larger if images acquired on MR systems of different vendors shall be processed with the same segmentation algorithm. One reason for this is that generally not all acquisition and reconstruction parameters of third party MR vendors are known which makes the control of them even more difficult for the company that sells the segmentation algorithm and that has to define the specifications of how to acquire the images.

A phantom may be designed that comprises samples that mimic the relaxation parameters and proton density of the body tissue types that are relevant for segmentation. This phantom is imaged with the same specific sequence(s) and parameter set that is/are used for acquisition of the patient images that shall be segmented. The phantom images may also subjected to the same image post-processing. The phantom images may be stored with or even within the DICOM patient images. The phantom images may be automatically pre-processed on the MR console directly after acquisition such that the grey values of the various samples are evaluated and stored in the DICOM headers of the patient images.

Image segmentation algorithms use the pre-processed grey value tables that come with the DICOM patient images. Training of segmentation algorithms may be done in relation to the grey value tables or for specific reference values. Effectively, this makes the training independent from the exact set of scan parameters. For example, the phantom grey values of grey matter, white matter, and CSF can be used to adapt the segmentation algorithm to the specific contrasts between those tissues.

Various examples for the tissue phantom may include:
a) On-body phantom

The phantom is positioned on or beside the patient. The phantom may have an elongated shape that fits between the arm and the trunk of the patient.

b) In-coil phantom

The phantom is built into an MR-receive coil. One example is to include the phantom into the head rest of a head coil (FIG. 1), or into the patient support that for Ingenia systems also contains receive coils.

c) Stand-alone phantom

The phantom is a separate passive device. It can be located on the patient support superior to the head of the patient.

d) Phantom with coils

The phantom is an active device that includes own receive coils and a coil connector, if it is designed as stand-alone phantom.

e) Always with patient imaging

The phantom may be imaged together with the patient in the same exam. The phantom can be imaged at the same time as the region of interest of the magnetic resonance image, or it may be imaged separately from the region of interest of the magnetic resonance image. The magnetic resonance image may be acquired using a particular magnetic resonance imaging protocol for its region of interest. The phantoms can be imaged by using the same magnetic resonance imaging protocol, but with a shift in the region of interest.

In some examples the scanner keeps a history of all scans with their parameter sets that have been executed since installation, and it also stores the phantom images acquired with those scans in a separate database. If a newly requested scan has parameters that are identical to a previous scan, then the phantom images/grey values of the previous scan from the database are reused and stored with the new patient images. If a newly requested scan has a new set of parameters, the scanner actively requests a new phantom scan. In case of a stand-alone phantom, the scanner demands from the user to put the phantom in place.

A known relation of tissue types to grey may values help in image segmentation. However, it is also obvious that the grey values of two different tissue types may be almost identical for a specific scan type. This may be improved by acquisition with two different scan types A and B that offer a different image contrast.

Example for standardized presentation for radiological reporting. The known relation of grey values per tissue type may be used to pre-process patient images such that they have a standardized contrast when used for radiological reporting. As an example, images may be segmented with model-based segmentation, and the grey values in a specific organ may be adjusted for image presentation such that the grey value is standardized for this type of sequence. This would calibrate for minor changes of grey values in the raw images depending on the exact settings of e.g. TR and TE, and flip angle for a given sequence type.

A standardized phantom may also be established as an industry standard that allows to relate image contrasts of one sequence type but with slightly varying acquisition parameters.

Figure 6:
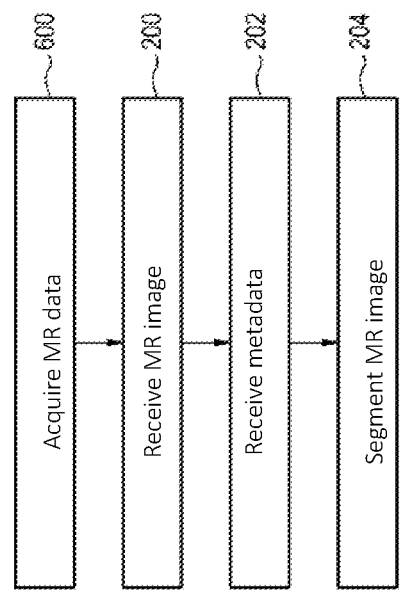
FIG. 6 shows a flow chart which illustrates an example of a method for operating the medical imaging system of FIG. 3 or 4.

FIG. 6 shows a flowchart which illustrates a method of operating the medical imaging system 300 of FIG. 3 or the medical imaging system 400 of FIG. 4. The method illustrated in FIG. 6 is similar to that shown in FIG. 2 with one additional step. First in step 600 the magnetic resonance imaging system 300 is controlled with the pulse sequence commands 300 to acquire the magnetic resonance data 332.

In step 200 the magnetic resonance image is received by reconstructing the magnetic resonance image 122 from the magnetic resonance data 332. In step 202 the reference grayscale value data 202 is generated by either extracting data from the additional magnetic resonance image 402 as shown in FIG. 4 or using the image reconstruction module 334 and the pulse sequence commands 330 as is shown in FIG. 3. After step 202 the method then proceeds to step 204 as is also illustrated in FIG. 2.

Some examples may simulate the reference gray values of relevant tissues in the MR scanner for the specific acquisition protocol, store it together with the acquired images and use this information in clinical workstations for visualization, post-processing and segmentation to make the functionality less protocol dependent. In particular, when using supervised machine learning approaches for segmentation that require gray-value images and corresponding ground truth annotation of anatomical structures or organs for algorithm training, the variation of image gray-values between different scans is compensated using the reference tissue gray values. When performing segmentation of a previously unseen image, the same mechanism is used to "configure" the algorithm for the specific protocol of the image to be segmented.

The approach allows to make image segmentation in clinical applications less protocol (or vendor) dependent, enables a more efficient diagnostic MR workflow in the clinic and is therefore relevant for MR scanners, Oncology solutions (MR-based radiation therapy planning) and clinical applications.

MRI offers a huge flexibility to design acquisition protocols and to generate images with considerably differing image appearance and sampling properties. While image analysis algorithms work usually well when optimized for a specific scanner type and protocol, especially when using methods to standardize the image intensities, clinical sites like to exploit the flexibility and versatility of MRI imaging and (slightly) adapt scanning protocols to their local needs and preferences. As a result, automated image analysis algorithms either perform suboptimal or need to be adapted. This limits the widespread support of MRI post-processing applications in commercial products and hampers the MR workflow compared to other imaging modalities like CT.

Figure 7:
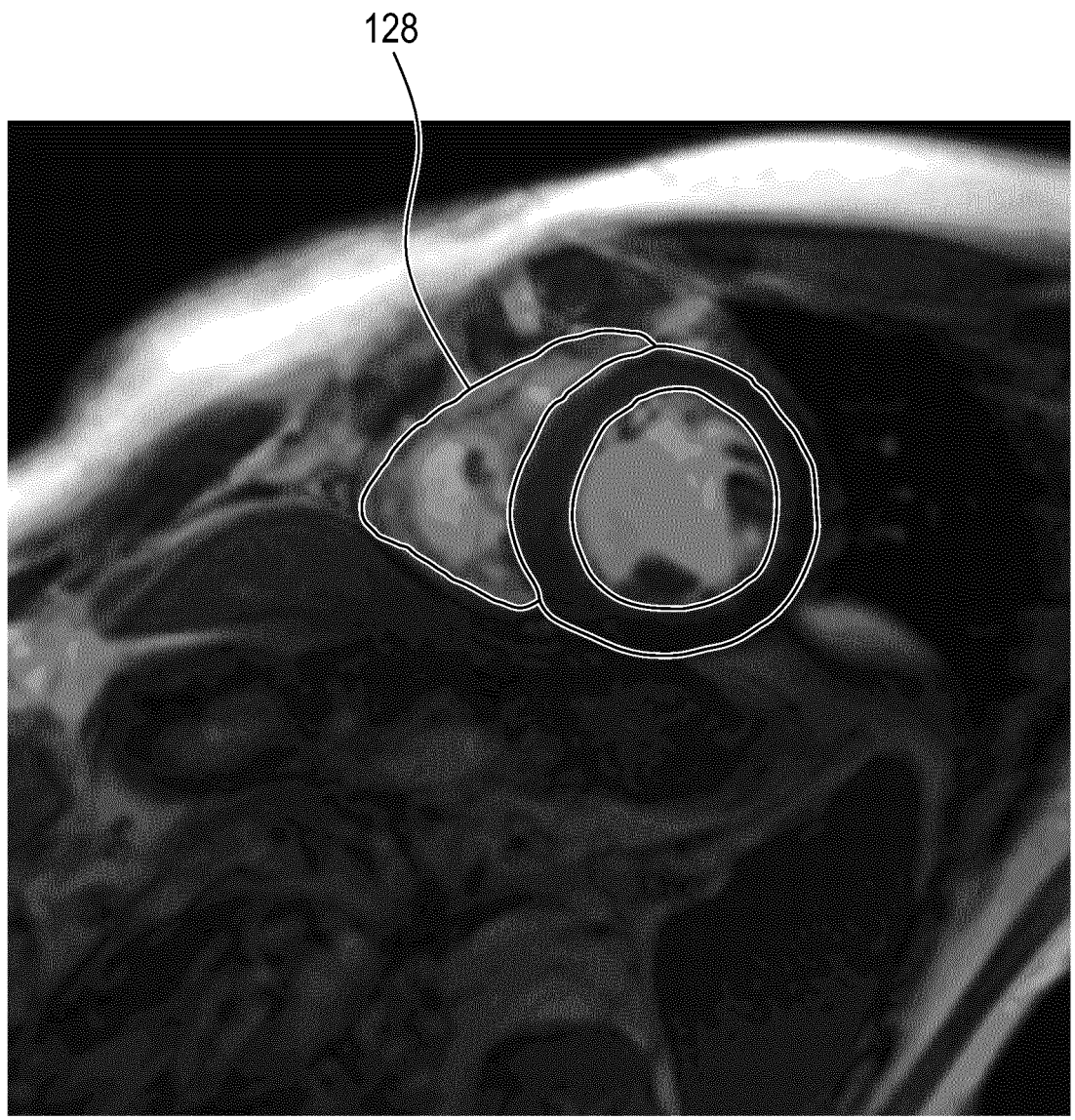
FIG. 7 shows an example of a magnetic resonance image.
Figure 8:
FIG. 8 shows a further example of a magnetic resonance image.
Figure 9:
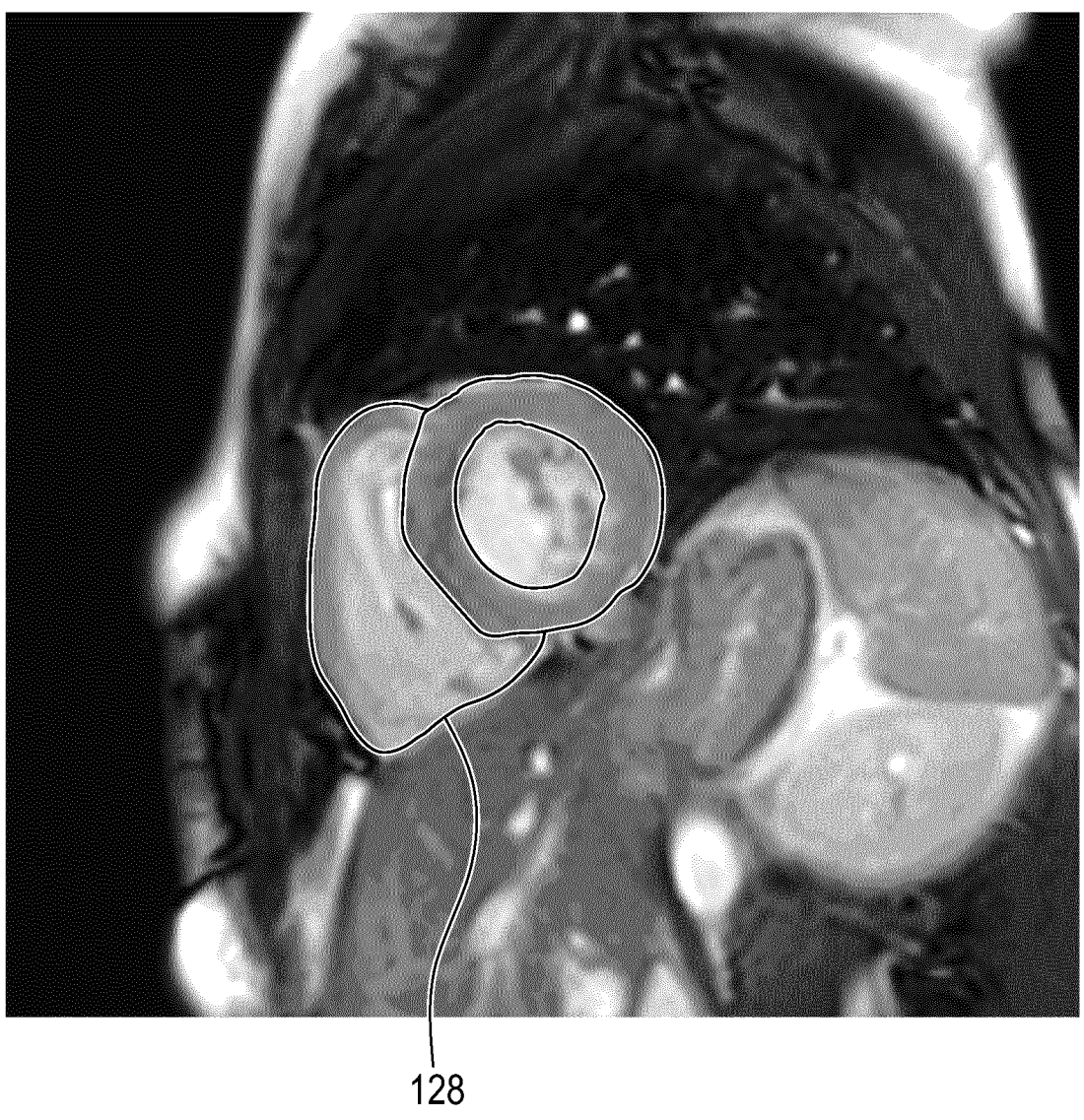
FIG. 9 shows a further example of a magnetic resonance image.

FIGS. 7, 8 and 9 each show a Cine-cardiac magnetic resonance image from different clinical sites. Each shows an image segmentation 128 superimposed on the image. FIG. 7 illustrates an example of a magnetic resonance image with a dark appearance. FIG. 8 represents an image with a medium brightness and FIG. 9 represents a magnetic resonance image with a so called bright appearance. Experiments for instance with model-based segmentation have shown that images can be segmented with higher accuracy if the algorithm is trained on each of these three image classes separately compared to algorithm training on all image classes simultaneously. Examples may provide for a means of processing all three types of images with the same training.

Examples may provide for training image segmentation approaches such as model-based segmentation for varying MR acquisition protocols and to make subsequent MR image segmentation less protocol specific or protocol agnostic. As a result, automated image segmentation algorithms perform better over a range of different scanners or MR acquisition protocols and do need to be adapted for each protocol/scanner variant to achieve optimal performance (in terms of segmentation accuracy or robustness).

Some examples may provide for the simulation of the reference gray values of relevant tissues in the MR scanner for the specific acquisition protocol, store it together with the acquired images and use this information in clinical workstations for visualization, post-processing and segmentation to make the functionality less protocol dependent. In particular, when using supervised machine learning approaches for segmentation that require gray-value images and corresponding ground truth annotation of anatomical structures or organs for algorithm training, the variation of image gray-values between different scans is compensated using the reference tissue gray values. When performing segmentation of a previously unseen image, the same mechanism is used to "configure" the algorithm for the specific protocol of the image to be segmented.

Figure 10:
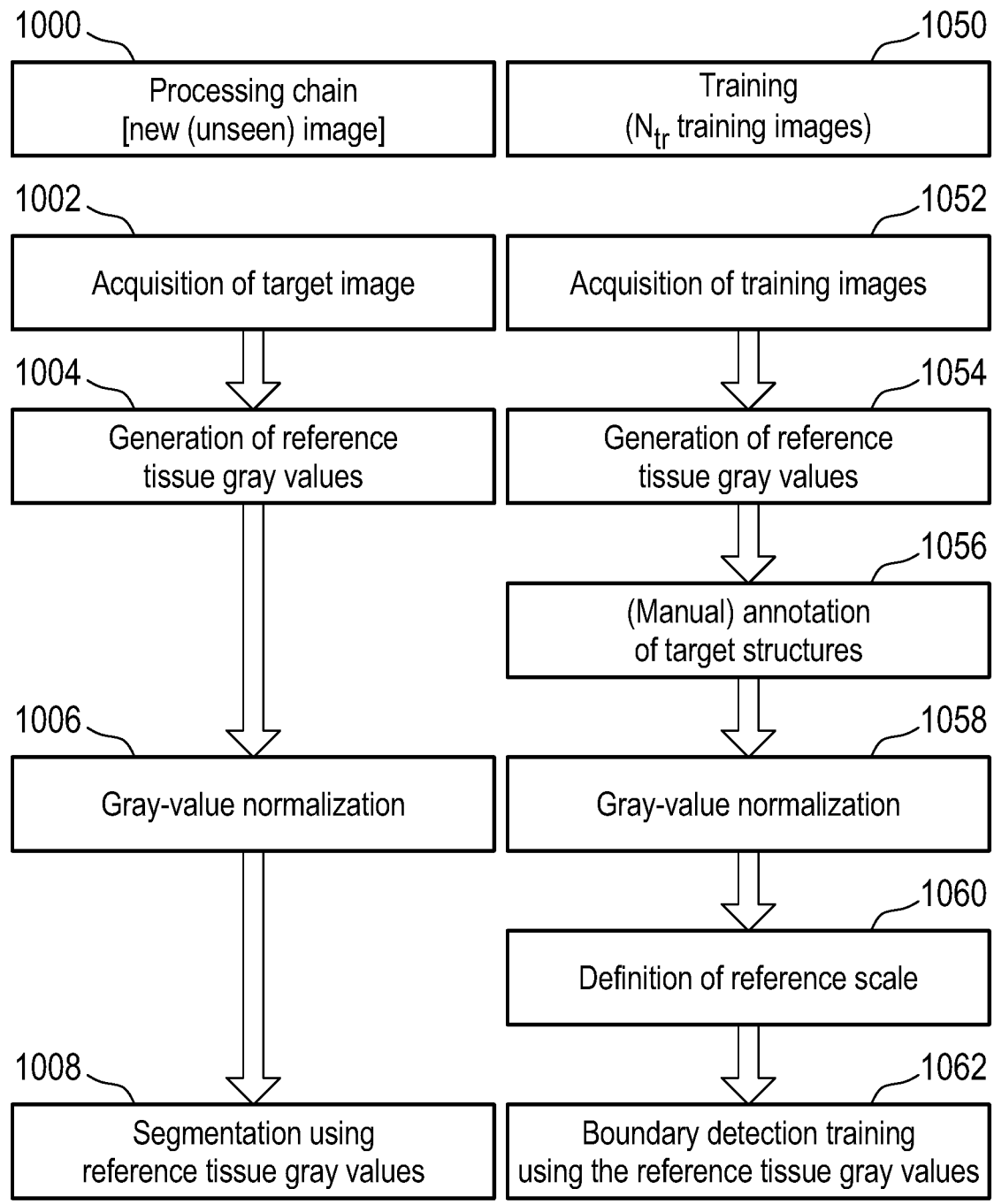
FIG. 10 illustrates an example of a method.

FIG. 10 provides an overview of the different processing steps. FIG. 10 also shows the steps for constructing such an algorithm using model-based segmentation. In the following text the processing steps are explained in more detail. FIG. 10 illustrates two methods; there is a method 1000 which shows a processing chain for processing a new unseen image. The method illustrated by the blocks 1050 represents a training method for training images for the processing chain 1000. These two methods are explained in the text below.

The processing chain for protocol diagnostic MR segmentation 1000 may comprise one or more of the following steps:

Acquisition 1002 of a new magnetic resonance image with a specific MR protocol on a specific system Generation 1004 of reference tissue gray values (reference grey scale value data) for the actual acquisition protocol and system settings. The reference tissue gray-values may be generated by simulation in the MR system and tissue gray values may subsequently be stored and passed together with the MR images.

Normalization 1006 of image gray values. It is assumed that the simulation approach allows to simulate tissue gray values in an image up to a scaling factor that can differ between different acquisitions. Normalization compensates this difference. Normalization may be done explicitly (i.e. the image normalized and stored in the memory) or implicitly (i.e. when evaluating image gray values during segmentation.

Image segmentation 1008: The segmentation algorithm uses the reference tissue gray-values to "configure" the algorithm for the specific MR acquisition protocol and performs segmentation.

Generation of tissue gray-values 1004: For the different imaging sequences, explicit formulas have been developed that describe the image contrast in dependence of tissue characteristics such as the proton density p and relaxation times T1 and T2 and acquisition parameters such as the echo time Te or repetition time Tr (see FIG. 3). In addition, MR simulators have been developed that simulate highly realistic MR images for complex sequences. These simple or more complex approaches are used to simulate (typical) tissue gray values (and optionally also their variation) for the actual imaging sequence and a number of tissues relevant for the actual acquisition and clinical task (also including those tissues relevant for the subsequent segmentation task). For complex simulations, many scanner specifics can be included in the simulation and the simulated tissue gray values may be computed directly on the MR scanner and stored together with the image (e.g. as DICOM tag). It is assumed that the actual simulation approach used in the context of this invention allows to simulate tissue gray values in an image up to a scaling factor that can differ between different acquisitions.

Alternatively, the tissue reference values may be obtained by imaging a phantom with build in inclusions of different materials representative for the desired/relevant tissues and suitable post-processing.

Gray value normalization 1006: To compensate for image intensity variations between different images, the image histogram and its low and high L % percentile (L=2 or 5) is computed. The intensity values are then re-scaled to a reference interval. Normalization may be done explicitly (i.e. the image normalized and stored in the memory) or implicitly (i.e. when evaluating image gray values during processing).

As an alternative grey value normalization, histogram matching can be used. As an alternative grey value normalization, histogram matching can be used. In this case, the meta data provided by the magnetic resonance imaging system may not only comprise tissue reference values of the most frequent tissues in the imaged region, but also the frequency and typical spread of the tissue reference values in the form of a reference grey value histogram. Alternatively, the medical imaging system may comprise information about the frequencies and spread of reference tissues and construct a reference grey value histogram using the tissue reference values. Grey value normalization is then done by re-scaling the image grey values until an optimal match between the image histogram and the reference grey value histogram is obtained.

Changing a magnetic resonance imaging protocol can result in the brightness of various tissues types within an MRI image changing relative to each other as well as in scale. Histogram matching, as described above, may have the advantage that the image can be modified such that the relative positions of tissue types within a grey scale histogram can be altered. Histogram matching may therefore enable compensation for larger changes in the magnetic resonance imaging protocols than can be compensated for by normalization.

Definition of reference scale: In addition, the reference tissue gray-values may be normalized and mapped to the reference interval. For that purpose, the training images with corresponding ground truth (GT) annotations are used. In particular, the mean gray value and its standard deviation are computed for each tissue class in each image. Suitable (scale and shift) parameters for mapping the reference tissue gray-values onto the reference scale can be obtained, for instance, via (weighted) least squares fitting of the linearly transformed reference tissue gray-values and the mean gray values of the tissue classes. With a properly chosen reference interval, the gray-values after scaling correspond approximately to the gray-values resulting from MR simulation.

Model-based segmentation 1008: In model-based segmentation a mesh model of the target anatomy with V vertices and T triangles is adapted to an image. First, the anatomical structure is detected using the Generalized Hough Transformation (GHT). Afterwards, parametric model adaptation is performed. For that purpose, boundary points are detected along profiles parallel to the triangle normals $n_i$ using individually trained boundary detectors $F_i(x, n_i)$ for each triangle i. The model is transformed using a transformation T(q) depending on the parameters q and the transformation parameters q are updated by minimizing an external energy that attracts the triangle centers of the mesh model to the detected boundary points. Boundary detection and refinement of the parameters q are iterated several times. Parametric adaptation may be done in several stages using transformations with increasing degrees of freedom. In a final stage, adaptation is performed by iterating boundary detection and mesh deformation. Mesh deformation optimizes an energy composed of the external energy of and an internal energy that penalizes deviations from the reference mesh model.

While GHT-based organ detection shows very little dependence on the acquisition protocol, because the GHT relies on image gradient information, accurate boundary detection is sensitive to the image appearance. Boundary detectors are, therefore constructed that use the (normalized) reference tissue gray values $I_{T_a,P}$ to reduce the effect of the imaging protocol P on boundary detection. Assuming that the boundary detector $F_i(x, n_i)$ has been chosen to separate tissue a from tissue b, gray values are evaluated for this boundary detector according to $$I^*(x+\xi) = \begin{cases} I(x+\xi) + \\ I_{T_a,P} - I_{T_a,P_{ref}} & \text{if } x+\xi \text{ is on the side of tissue } a \text{ w.r.t. } n_i \\ I(x+\xi) + \\ I_{T_b,P} - I_{T_b,P_{ref}} & \text{if } x+\xi \text{ is on the side of tissue } b \text{ w.r.t. } n_i \end{cases} \quad (1)$$

Figure 11:
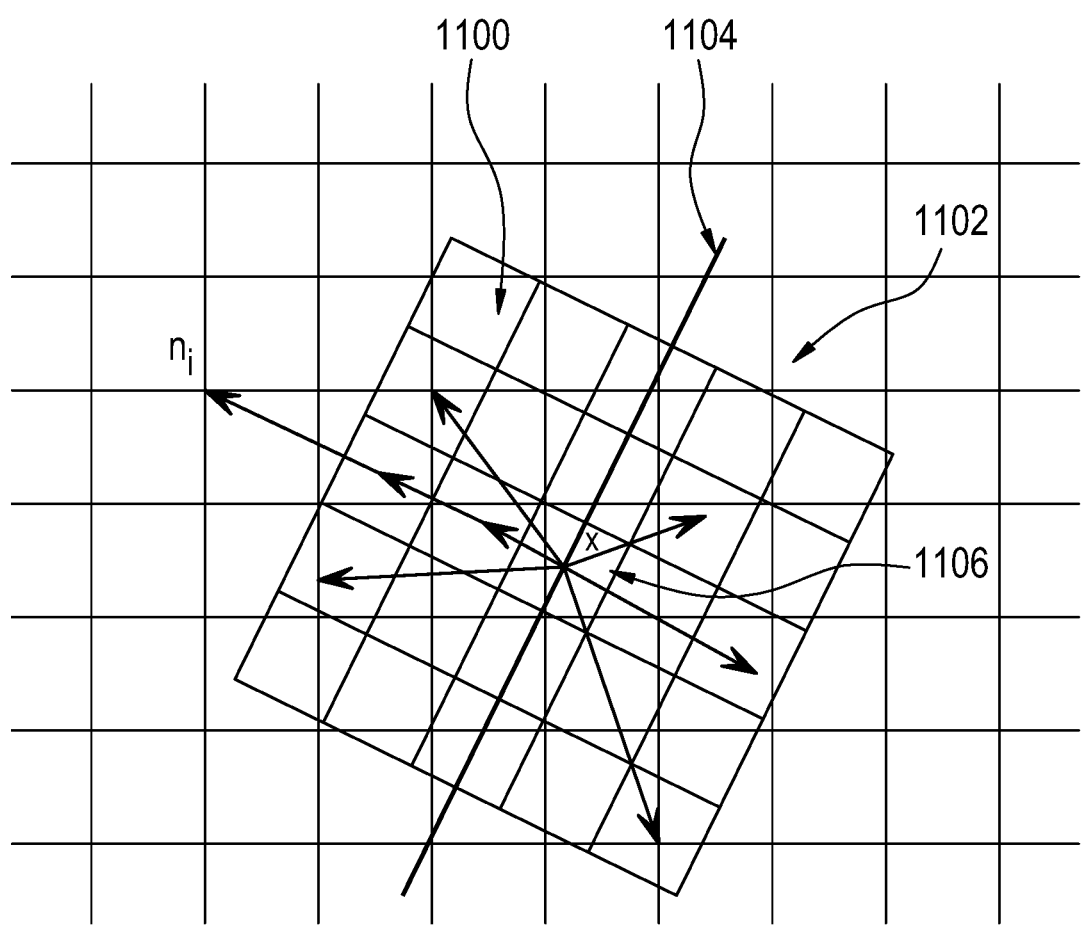
FIG. 11 illustrates the modification of a segmentation algorithm with reference gray scales.

$I_{T_a,P_{ref}}$ and $I_{T_b,P_{ref}}$ correspond to the (normalized) reference tissue gray-values of a reference protocol Pref used during boundary detection training. The evaluation of the boundary detection functions is illustrated in FIG. 11. FIG. 11 illustrates evaluation of the boundary detection functions $F_i(x, n_i)$. The parameters x and $n_i$ describe the position and orientation of the assumed boundary that separates tissue A and tissue B. FIG. 11 shows a region of tissue A 1100 and a region of tissue B 1102 separated by a boundary 1104. The gradient information is taken at the point 1106.

The training method 1050 may include the acquisition of the training images 1052 and then the generation of the reference tissue values 1054 either by simulation or by measurement in phantoms. Next anatomical structures are manually annotated 1056 as target structures. Then in step 1058 gray-value normalization is performed. In step 1060 a definition of the reference scale is performed. Finally in step 1062 boundary detection training is performed using the reference tissue gray values.

Boundary detection training in one example may be performed by using huge pool of boundary detection functions that are generated in a first step e.g. by analyzing the gray-value properties at the rim of the organ or anatomical structure to be segmented. To adopt this procedure, a reference image and associated protocol preferences are selected and the gray-values of all other training images are "transformed" to this reference protocol, i.e. for each tissue a of the GT annotation the gray-values of training image j are modified by subtracting the reference tissue gray value $I_{T_a,P_j}$ and adding the (normalized) reference tissue gray value $I_{T_a,P_{ref}}$ of the reference image/protocol. As result a huge pool of boundary detection functions is obtained that depends on gray-values on both sides of the border to be detected (see FIG. 11).

In a second step, of this example a boundary detection assigns a function to each triangle of the organ mesh model by simulating boundary detection on the training data and assigning the boundary detection function with the smallest boundary detection error to respective triangle. This step can be carried out using the training images transformed to the reference protocol. Alternatively, the (normalized) training images can be used and acquisition protocol and reference tissue gray values can be taken into when evaluating a boundary detection function for a triangle as defined in eq. (1).

If the simulated gray values are only available for one of both tissues, for instance, if there is only an annotation of an organ/anatomical structure, but not of its surrounding, undefined reference tissue gray-values in eq. (1) can be omitted or set to zero.

Examples may make image segmentation in clinical applications less protocol (or vendor) dependent, enables a more efficient diagnostic MR workflow in the clinic and is therefore relevant for MR scanners and clinical applications.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer
104 hardware interface
106 processor
108 user interface
110 memory
120 machine executable instructions
122 magnetic resonance image
124 reference gray scale data
126 image segmentation algorithm
128 image segmentation
200 receive a magnetic resonance image
202 receive meta data descriptive of the magnetic resonance image
204 segment the magnetic resonance image using an image segmentation algorithm using the reference gray scale value data
300 magnetic resonance imaging system
304 magnet
306 bore of magnet
308 imaging zone
309 region of interest
309' region of interest
310 magnetic field gradient coils
312 magnetic field gradient coil power supply
314 radio-frequency coil
316 transceiver 318 subject
320 subject support
330 pulse sequence commands
332 magnetic resonance data
334 image reconstruction module
336 magnetic resonance simulator
400 magnetic resonance phantoms
402 additional magnetic resonance image
600 control the magnetic resonance imaging system using the pulse sequence commands to acquire the magnetic resonance data
1000 Processing chain
1002 acquisition of target image
1004 generation of reference gray values
1006 gray-value normalization
1008 segmentation using reference tissue gray values
1050 training
1052 acquisition of training images
1054 generation of reference tissue gray values
1056 (manual) annotation of target structures
1058 gray value normalization
1060 definition of reference scale
1062 boundary detection using the reference tissue gray values
1100 tissue region A
1102 tissue region B
1104 tissue boundary
1106 location where gradient is calculated

The invention claimed is:

1. A medical imaging system comprising:
a memory containing machine executable instructions;
a processor, wherein execution of the machine executable instructions cause the processor to:
receive a magnetic resonance image;
receive meta data descriptive of the magnetic resonance image, wherein the metadata comprises reference gray scale value data as numerical values which are referenced respectively to two or more tissue types; and
segment the magnetic resonance image using an image segmentation algorithm that is modified on the basis of the reference gray scale value data;
wherein the medical imaging system comprises a magnetic resonance imaging system, wherein the medical imaging system further comprises pulse sequence commands for controlling the magnetic resonance imaging system to acquire magnetic resonance data, wherein execution of the machine executable instructions further causes the medical imaging system to:
control the magnetic resonance imaging system using the pulse sequence commands to acquire the magnetic resonance data;
reconstruct the magnetic resonance image from the magnetic resonance data; and
generate the reference gray scale value data.

2. The medical imaging system of claim 1, wherein the modification of the image segmentation algorithm includes modifying the boundary detection algorithm using the reference grayscale value data before segmenting the magnetic resonance image.

3. The medical imaging system of claim 1, wherein execution of the machine executable instructions further causes the processor to identify multiple phantom regions corresponding to each of two or more tissue types within the magnetic resonance image, wherein the reference gray scale values data is at least partially determined using the magnetic resonance image.

4. The medical imaging system of claim 1, wherein the magnetic resonance imaging system comprises an imaging coil, wherein the imaging coil comprises a magnetic resonance phantom for each of the two or more tissue types.

5. The medical imaging system of claim 4, wherein the magnetic resonance phantom for each of the two or more tissue types has a predetermined geometric location relative to each other, wherein the multiple phantom regions are identified at least partially using the predetermined geometric location.

6. The medical imaging system of claim 5, wherein the phantom for each of the two or more tissue types comprises a phantom material with a proton density, a T1 value, and a T2 value which models the two or more tissue types.

7. The medical imaging system of claim 1, wherein the image segmentation algorithm comprises an anatomical atlas matching algorithm for segmenting the magnetic resonance image, wherein the anatomical atlas matching algorithm is adjusted using the reference gray scale values.

8. The medical imaging system of claim 1, wherein the image segmentation algorithm comprises a mesh model for segmenting the magnetic resonance image, wherein the mesh model is adjusted using the reference gray scale values.

9. The medical imaging system of claim 1, wherein the image segmentation algorithm comprises a voxel classifier for segmenting the magnetic resonance image by classifying individual voxels using gray scale values and a neighborhood of the individual voxels, wherein the voxel is adjusted using the reference gray scale values.

10. The medical imaging system of claim 1, wherein execution of the machine executable instructions further cause the processor to:
re-scale gray values of the magnetic resonance image to a reference interval; and
re-scale the reference gray scale value data to the reference interval.

11. The medical imaging system of claim 1, wherein the metadata is contained in the DICOM header of the magnetic resonance image.

12. A computer program product comprising machine executable instructions stored on a non-transitory computer readable medium for execution by a processor controlling a medical imaging system, wherein execution of the machine executable instructions cause the processor to:
receive a magnetic resonance image;
receive meta data descriptive of the magnetic resonance image, wherein the metadata comprises reference gray scale value data as numerical values which are referenced respectively to two or more tissue types; and
segment the magnetic resonance image using an image segmentation algorithm that is modified on the basis of the reference gray scale value data;
wherein the image segmentation algorithm comprises a voxel classifier for segmenting the magnetic resonance image by classifying individual voxels using gray scale values and a neighborhood of the individual voxels, wherein the voxel is adjusted using the reference gray scale value data.

13. A method of operating a medical imaging system, wherein the method comprises:
receiving a magnetic resonance image;
receiving meta data descriptive of the magnetic resonance image, wherein the metadata comprises reference gray scale value data as numerical values which are referenced respectively to two or more tissue types;

segmenting the magnetic resonance image using an image segmentation algorithm that is modified on the basis of the reference gray scale value data;
re-scaling gray values of the magnetic resonance image to a reference interval; and
re-scaling the reference gray scale value data to the reference interval.

\* \* \* \* \*